United States Patent [19]

Nakayama

[11] 4,388,693

[45] Jun. 14, 1983

[54] NON-RECURSIVE DIGITAL FILTER

[75] Inventor: Kenji Nakayama, Tokyo, Japan

[73] Assignee: Nippon Electric Co., Ltd., Tokyo, Japan

[21] Appl. No.: 221,808

[22] Filed: Dec. 31, 1980

[30] Foreign Application Priority Data

Jan. 7, 1980 [JP] Japan ..................................... 55-404

[51] Int. Cl.³ ............................................. G06F 15/31
[52] U.S. Cl. .................................................... 364/724
[58] Field of Search ......................................... 364/724

[56] References Cited

U.S. PATENT DOCUMENTS

| 4,136,398 | 1/1979 | Eggermont | 364/724 |
| 4,231,100 | 10/1980 | Eggermont | 364/724 |
| 4,255,794 | 3/1981 | Nakayama | 364/724 |

OTHER PUBLICATIONS

*IEEE Transactions on Communications*, vol. COM-23, No. 2, 2/75, "A New Type of Digital Filter for Data Transmission".
*McGraw-Hill Book Company, Inc.*, 1962, Yaohan Chu, "Design Fundamentals".
*Signetios Logic-TTL*, May, 1978, Data Manual, "Signetics".

*Primary Examiner*—Jerry Smith
*Attorney, Agent, or Firm*—Laff, Whitesel, Conte & Saret

[57] ABSTRACT

A non-recursive digital filter has N predetermined filter coefficients to perform a specific computation in response to a sequence of consecutive binary codewords. The absolute values of the computation coefficients are arranged in an order of magnitude. The filter arranges the sequence to obtain a sequence corresponding to the arranged coefficients. A product is obtained for each sequence, which is given by the arrangement and by the corresponding polarity of each of the coefficients. The outputs given by these products are accumulated and are multiplied by certain differences.

4 Claims, 6 Drawing Figures

| TAP NUMBER OF DELAY ELEMENTS | $h_i$ ORIGINAL COEFFICIENTS | $h^*_j$ REARRANGED COEFFICIENTS IN ORDER OF $h_i$ VALUE | $\Delta_j$ FIRST DIFFERENCE COEFFICIENTS |
|---|---|---|---|
| 0 | $h_0 = 0.03125$ | $h^*_0 = 0.03125$ | $\Delta_0 = 0.03125$ |
| 1 | $h_1 = -0.03125$ | $h^*_1 = 0.03125$ | $\Delta_1 = 0.0$ |
| 2 | $h_2 = -0.15625$ | $h^*_2 = 0.03125$ | $\Delta_2 = 0.0$ |
| 3 | $h_3 = 0.0625$ | $h^*_3 = 0.03125$ | $\Delta_3 = 0.0$ |
| 4 | $h_4 = 0.5$ | $h^*_4 = 0.0625$ | $\Delta_4 = 0.03125$ |
| 5 | $h_5 = 0.5$ | $h^*_5 = 0.0625$ | $\Delta_5 = 0.0$ |
| 6 | $h_6 = 0.0625$ | $h^*_6 = 0.15625$ | $\Delta_6 = 0.09375$ |
| 7 | $h_7 = -0.15625$ | $h^*_7 = 0.15625$ | $\Delta_7 = 0.0$ |
| 8 | $h_8 = -0.03125$ | $h^*_8 = 0.5$ | $\Delta_8 = 0.34375$ |
| 9 | $h_9 = 0.03125$ | $h^*_9 = 0.5$ | $\Delta_9 = 0.0$ |

FIG.3

| $\Delta_j$ $(j=0\sim9)$ FIRST DIFFERENCE COEFFICIENTS | $\Delta^*_\ell$ $(\ell=0\sim9)$ REARRANGED COEFFICIENTS IN ORDER OF $\Delta_j$ VALUE | $c_\ell$ $(\ell=0\sim9)$ SECOND DIFFERENCE COEFFICIENTS |
|---|---|---|
| $\Delta_0 = 0.03125$ | $\Delta^*_0 = 0.0$ | $c_0 = 0.0$ |
| $\Delta_1 = 0.0$ | $\Delta^*_1 = 0.0$ | $c_1 = 0.0$ |
| $\Delta_2 = 0.0$ | $\Delta^*_2 = 0.0$ | $c_2 = 0.0$ |
| $\Delta_3 = 0.0$ | $\Delta^*_3 = 0.0$ | $c_3 = 0.0$ |
| $\Delta_4 = 0.03125$ | $\Delta^*_4 = 0.0$ | $c_4 = 0.0$ |
| $\Delta_5 = 0.0$ | $\Delta^*_5 = 0.0$ | $c_5 = 0.0$ |
| $\Delta_6 = 0.09375$ | $\Delta^*_6 = 0.03125$ | $c_6 = 0.03125$ |
| $\Delta_7 = 0.0$ | $\Delta^*_7 = 0.03125$ | $c_7 = 0.0$ |
| $\Delta_8 = 0.34375$ | $\Delta^*_8 = 0.09375$ | $c_8 = 0.0625$ |
| $\Delta_9 = 0.0$ | $\Delta^*_9 = 0.34375$ | $c_9 = 0.25$ |

FIG.4

NON-RECURSIVE DIGITAL FILTER

The present invention relates to a non-recursive digital filter and, more particularly, to a non-recursive digital filter designed to use differences in filter coefficients between adjacent multipliers as new coefficients.

A digital filter is a device to perform the digital operation for a binary coded word (codeword) sequence obtained through the analog to digital (A/D) conversion of an analog signal, such as a speech signal, to produce desired filtering characteristics, such as frequency or delay characteristics.

In general, each of the digital filters is classified into either a recursive filter ("R-filter") having a feedback loop or a non-recursive filter ("NR-filter") having no feedback loop. One example of such an R-filter is disclosed in the U.S. Pat. No. 4,215,415. This filter achieves the desired filtering characteristics by connecting second-order filtering sections in cascade form. However, the R-filter cannot be used as a filter for achieving linear-phase characteristics, which are indispensable to the well-known VSB (vestigial side band) transmission system for television broadcasting or the like.

Such an NR-filter, on the other hand, can be used in an MODEM (modulator and demodulator), an echo canceller, or a like device, because the filter enables the achieving of a wide range of linear-phase and/or delay characteristics. To realize steep filtering characteristics, however, this filter requires a considerable number of multipliers, resulting in an expensive, complicated device.

For these reasons, an improved NR-filtering device has been proposed in a paper entitled "A New Type of Digital Filter for Data Transmission", by Fred A. M. Snijders et al., IEEE Transactions of Communicatons, Vol. COM-23, No. 2, February issue, 1975, pp. 222–234.

The device illustrated in FIG. 4 on page 224 of this article includes an NR-filter designed to use differences in filter coefficients between adjacent multipliers as new coefficients, and an integrator for integrating the output of the NR-filter. Such a filter, however, tends to oscillate, deteriorating the desired filtering characteristics, because the gain of the feedback loop used in the integrator is set at an absolute value of "1". The setting of the feedback loop gain at an integer consequently restricts the filtering characteristics to be achieved.

One object of the present invention, therefore, is to provide an improved NR-filter capable of achieving the desired filtering characteristics through a relatively small number of operations.

According to one aspect of the invention, a non-recursive digital filter has N predetermined filter coefficients $h_i(i=0 \text{ to } N-1)$ to perform $$y(n) = \sum_{i=0}^{N-1} h_i x(n-i) = \sum_{j=0}^{N-1} \text{sign}(h_i) h^*_j x^*(n-j) =$$

$$\sum_{j=0}^{N-1} h^*_j \tilde{x}^*(n-j) = \sum_{j=0}^{N-1} \Delta_j u(n-j)$$

in response to a sequence $x(n-i)$ of N consecutive binary codewords, where: $h^*_j$ represents the coefficients of the absolute values of $h_i$ arranged in the order of magnitude; $x^*(n-j)$ represents $x(n-i)$ corresponding to $h^*_j$; $\text{sign}(h_i)$ represents the polarities of $h_i$; $\Delta_j$ represents differences between adjoining coefficients $h^*_j$; $\tilde{x}^*(n-j)$ represents the products of $\text{sign}(h_i)$ and $x^*(n=j)$; and $$u(n-j) = \sum_{k=j}^{N-1} \tilde{x}^*(n-k).$$

The filter comprises arranging means for arranging the sequence $x(n-i)$, corresponding to the coefficients $h^*_j$, to obtain $x^*(n-j)$; first means for obtaining the product of each of the outputs $x^*(n-j)$ given from the arranging means and the corresponding polarity of each of the coefficients $h_i$; second means for accumulating the outputs $\tilde{x}^*(n-j)$ given from said first means to obtain $u(n-j)$; third means for multiplying the outputs $u(n-j)$ supplied from said second means by the differences $\Delta_j$; and fourth means for accumulating the outputs $\Delta_j u(n-j)$ given from the third means.

The invention will be described in greater detail in conjunction with the accompanying drawings, wherein:

FIGS. 3 and 4 show tables giving examples of filter coefficients;

In the drawings, the same reference numerals represent the same structural elements. It is to be noted that serial or parallel bits are supplied to signal paths shown in FIG. 2, whereas parallel bits alone, except for control signals, are supplied to the signal paths shown in FIG. 5.

Figure 1:
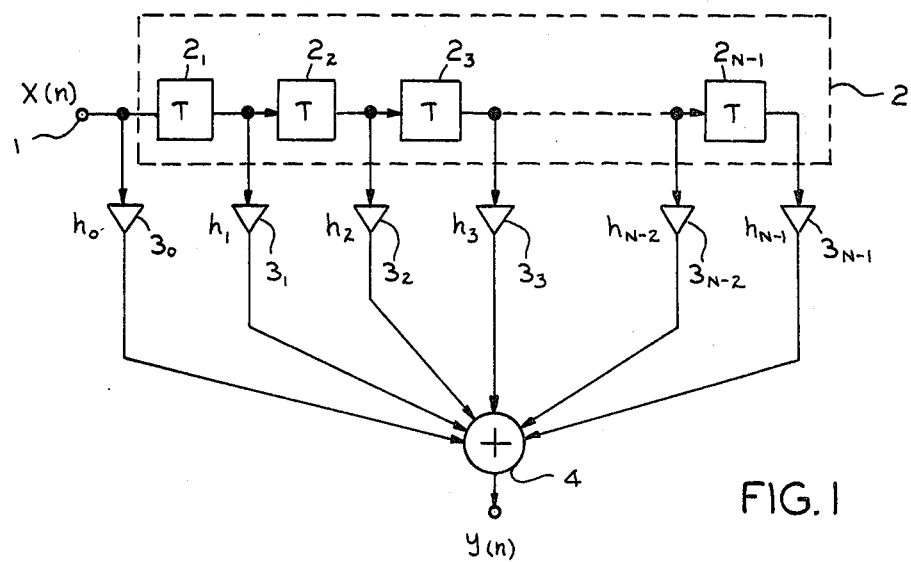
FIG. 1 shows a conventional NR-filter.

In FIG. 1, input terminal 1 receives a sequence $x(n)$ consists of a plurality of codewords (of 16 bits per word) obtained through the analog-to-digital (A/D) conversion of an analog signal at a sampling frequency $F_S$. The sequence $x(n)$ is given to a delay device 2 composed of $N-1$ delay elements $2_1$ through $2_{N-1}$, each having a delay time T equal to the sampling period $1/F_S$. The outputs $x(n)$ to $x(n-N+1)$ of the delay elements $2_1$ through $2_{N-1}$ are sent to multipliers $3_0$ through $3_{N-1}$, each having a corresponding filter coefficient $h_i(i=0, 1, \ldots, N-1)$ derived from a desired impulse response or frequency transfer function. The outputs of the multipliers $3_0$ through $3_{N-1}$ are sent to an adder 4 to give an output codeword sequence $y(n)$. Such a structure enables the achievement of the required filtering characteristics by appropriately varying the coefficients $h_i$.

Next, the process to derive the algorithm of the filtering operation employed in the present invention will be described in more detail. A differential formula representing the filtering operation of FIG. 1 in the time domain can be expressed as follows:

$$y(n) = \sum_{i=0}^{N-1} h_i x(n-i) \quad (1)$$

where N is the number of taps of the delay elements used, $x(n-i)$ is codeword at time $(n-i)$, and $h_i$ are filter coefficients (referred to hereunder as "coefficients") derived from the impulse response of the filter. The codewords taken out of the terminals of the delay elements $2_1$ through $2_{N-1}$ are $x(n)$ to $x(n-N+1)$.

Generally, a binary codeword may be expressed based on either a sign-magnitude representation using a sign bit for indicating the polarity (or sign) of the original analog signal and absolute value bits representing the magnitude of the signal or by two's complement representation. (For details of these representations, see Digital Computer Design Fundamentals published in 1962 by McGraw-Hill Book Company, Inc., pp. 10–15.) It is assumed now that the coefficient $h_i$ are represented by the sign-magnitude representation and the codewords $x(n-i)$ are represented by the two's complement representation.

Also, suppose that the absolute values of the coefficients $h_i$($h_0$ to $h_{N-1}$) are arranged in an ascending order of magnitude, as coefficients $h^*_j$(j=0 to N−1), $x(n-i)$ [$x(n)$ to $x(n-N+1)$] are arranged $x^*(n-j)$ in accordance with $h^*_j$. By such arrangement of $h_i$ and $x(n-i)$, equation (1) will be rewritten as follows:

$$h^*_j = |h_i|, h^*_0 \leq h^*_1 \leq h^*_2 \leq \ldots \leq h^*_{N-1} \qquad (2)$$

$$y(n) = \sum_{j=0}^{N-1} \text{sign}(h_i) h^*_j x^*(n - j)$$

where sign ($h_i$) indicate the signs of $h_i$, each of which has a value of either 1 or −1.

Assuming now that the products of the signs of the coefficients $h_i$ and $x^*(n-j)$ are represented by $\tilde{x}^*(n-j)$, equation (2) can be transformed as follows:

$$y(n) = \sum_{j=0}^{N-1} h^*_j \tilde{x}^*(n - j) \qquad (3)$$

Next, the differences $\Delta_j$ between adjoining coefficients $h^*_j$ and $h^*_{j-1}$ will be expressed as follows:

$$\Delta_j = h^*_j - h^*_{j-1}, j=0, 1, \ldots N-1 \ h^*_{-1}=0 \qquad (4)$$

Here, the sum of all the codewords rearranged from the j-th through the (N−1)-th can be expressed by:

$$u(n - j) = \sum_{k=j}^{N-1} \tilde{x}^*(n - k) \qquad (5)$$

By the substitution of equations (4) and (5) into equation (3), the following equation (6) can be obtained:

$$y(n) = \sum_{j=0}^{N-1} \Delta_j u(n - j) \qquad (6)$$

The values of $u(n-j)$ in equation (5) are obtained from the following equations (7) and (8):

$$U(n-j) = U(n-j-1) + \tilde{x}(n-j) \qquad (7)$$

$$J=0, 1, \ldots, N-2$$

$$u(n-N+1) = \tilde{x}^*(n-N+1) \qquad (8)$$

Equation (1) represents the sum of each of the products of the coefficients $h_i$($h_i$ to $h_{N-1}$) and the codewords $x(n-i)$[$x(n)$ to $x(n-N+1)$], as indicated by equation (6), and can be converted into the sum of each of the products of the coefficient differences $\Delta_0$ to $\Delta_{N-1}$ and the codewords $u(n)$ to $u(n-N+1)$. Since the coefficient differences $\Delta_0$ to $\Delta_{N-1}$ include some zeros as shown in FIG. 3, the total number of the operations required in equation (6) is less than the total number required in equation (1).

For a further reduction of the number of the operations required in equation (6), the coefficients $\Delta_0$ to $\Delta_{N-1}$ in equation (6) are arranged in the ascending order of magnitude as $\Delta^*_l$, and as a result, each of the differences between adjoining coefficients $\Delta^*_l$ to $\Delta^*_{l-1}$ become $C_l$. Therefore, the following equation (9) is obtained:

$$C = \Delta^*_l - \Delta^*_{l-1}, \Delta^*_{-1} = 0 \qquad (9)$$

Also, assuming that $u(n-j)$ corresponding to the arranged coefficients $\Delta^*_l$ are $u^*(n-l)$ and the sum of the codewords arranged from the l-th through the (N−1)-th is $u(n-l)$, equation (6) can be rewritten by the use of both $u(N-n-1)$ and equation (9) as follows:

$$y(n) = \sum_{l=0}^{N-1} C_l u(n - l) \qquad (10a)$$

$$u(n - l) = \sum_{k=l}^{N-1} u^*(n - k) \qquad (10b)$$

The values of $u(n-l)$ in equation (10b) are obtained from equations (7) and (8) as follows:

$$u(n-l) = u(n-l-1) + u^*(n-l) \qquad (11)$$

$$l=0, 1, \ldots, N-2$$

$$u(n-N+1) = u^*(n-N+1) \qquad (12)$$

Because the coefficients $C_0$ to $C_{N-1}$ representing the differences in the coefficients $\Delta^*_0$ to $\Delta^*_{N-1}$ in equation (9) are virtually zero (see FIG. 4 to be described hereunder), the number of the operations required can be substantially reduced, as compared with the calculation required by equation (1).

Figure 2:
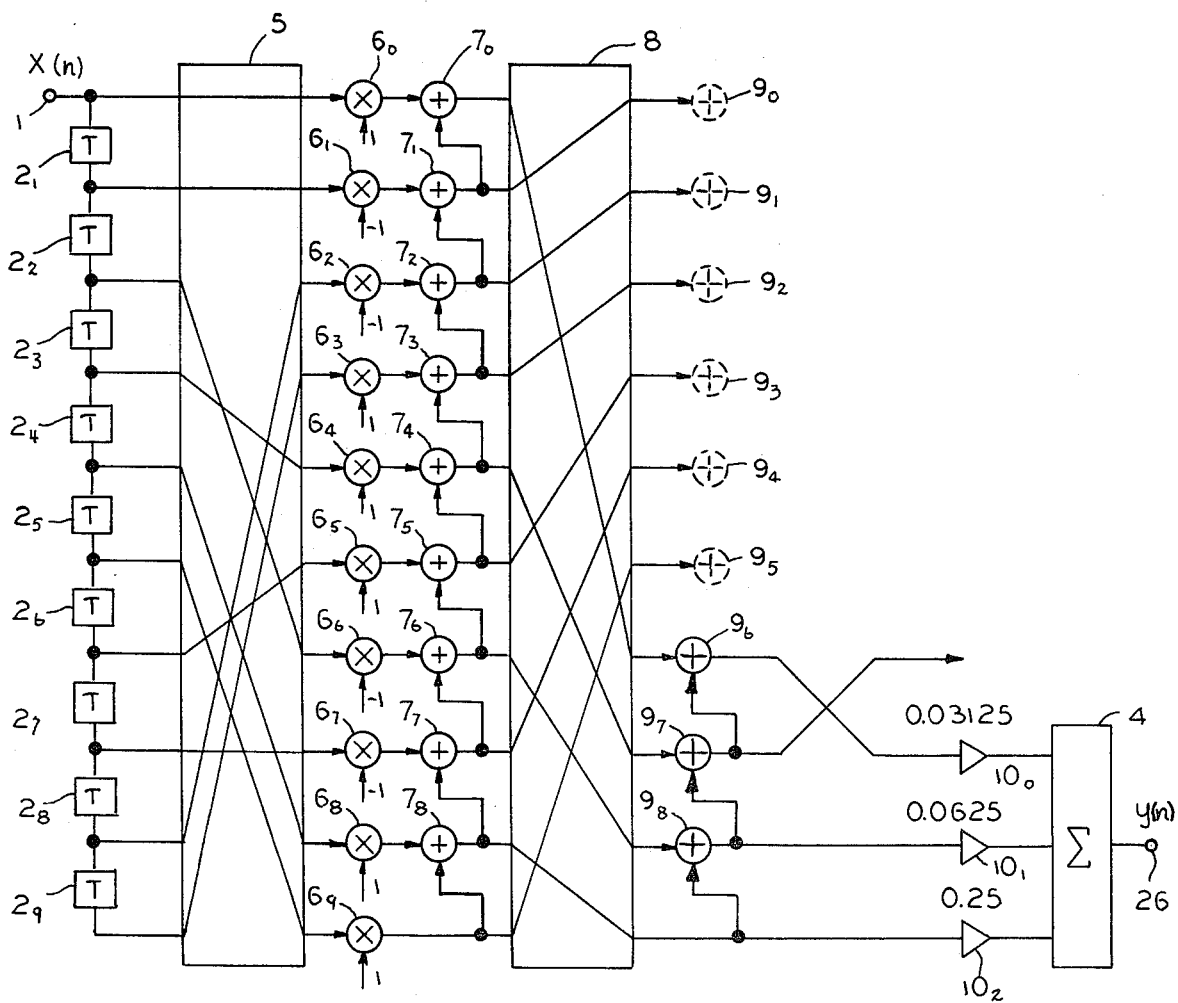
FIG. 2 shows a block diagram illustrating a first embodiment of the invention.

FIG. 2 shows a first embodiment which is designed to perform the filtering operations expressed by equations (10) through (12). The FIG. 2 filter functions as a low-pass filter whose multiplication coefficients $h_0$ to $h_9$ have the values of the original coefficients shown in FIG. 3. In FIG. 2, a codeword sequence $x(n)$ is fed to delay elements $2_1$ through $2_9$, each having a delay time equal to the sampling period $1/F_s$. The outputs $x(n)$ to $x(n-9)$ of the delay elements $2_1$ through $2_9$ are sent to a first arranging circuit 5. As a result, the codewords $x(n)$ to $x(n-9)$ are arranged corresponding to the coefficients $h^*_0$ to $h^*_9$, depending on the arrangement of the absolute values of the original coefficients $h_0$ to $h_9$ shown in FIG. 3. For instance, a coefficient $h_2 = -0.15625$ corresponds to the codeword $x(n-2)$ taken out of the second delay element $2_2$ (the second tap) which also corresponds to the sixth coefficient $h^*_6$, so that the codeword $x(n-2)$ is fed to the second input terminal of the circuit 5 and is taken out as $x^*(n-6)$ from the sixth output terminal of the circuit 5.

The circuit 5 shown in FIG. 2 is designed to have the shown wire connections to produce $x(n)^*$ to $x^*(n-9)$. Each of the outputs of the circuit 5 is multiplied by the corresponding sign of each of the coefficients $h_0$ to $h_9$ at multipliers $6_0$ through $6_9$, to give $\tilde{x}^*(n-j)$. The multiplication by 1 or −1 may be achieved by an Exclusive OR circuit. The outputs of the multipliers $6_0$ through $6_9$ are fed to adders $7_0$ through $7_9$, so that $$u(n-j) = \sum_{k=j}^{N-1} \tilde{x}*(n-k),$$

as shown in equation (5), may be calculated.

The outputs of the adders $7_0$ through $7_9$ are given to a second arranging circuit 8. The outputs $u(n-j)$ of the adders $7_0$ through $7_9$ are arranged, corresponding to the differences between adjoining ones in the arranged coefficients $\Delta^*_j$ and depending on the arrangement of coefficients $\Delta_j$ in the order of magnitude. For instance, since a coefficient $\Delta_0 = 0.03125$ corresponding to the output of the adder $7_0$ corresponds to the sixth coefficient $\Delta^*_6$, the output of the adder $7_0$ fed to the 0-th terminal of the circuit 8 is taken out from the 6-th terminal of the circuit 8.

The outputs of the circuit 8 are given to adders $9_6$ through $9_8$ in order to give $u(n-l)$. It is to be noted that adders $9_0$ through $9_5$ may be omitted, because $\Delta^*_0$ to $\Delta^*_5$, out of the coefficients $\Delta^*_l$, are zero. The outputs of the adders $9_6$ through $9_8$ are multiplied by $C_6$, $C_8$, and $C_9$ at multipliers $10_0$, $10_1$, and $10_2$, respectively. Since the coefficients $C_0$ to $C_5$ and $C_7$ are zero, no more than three multipliers are needed.

The outputs of the multipliers $10_0$, $10_1$, and $10_2$ are given to an adder 4. The output of the adder 4 is taken from an output terminal 26 as an output $y(n)$. This embodiment thus requires only three multipliers to achieve a substantial reduction in the number of the operations, as compared with the conventional FIG. 1 filter using ten multipliers.

Figure 5:
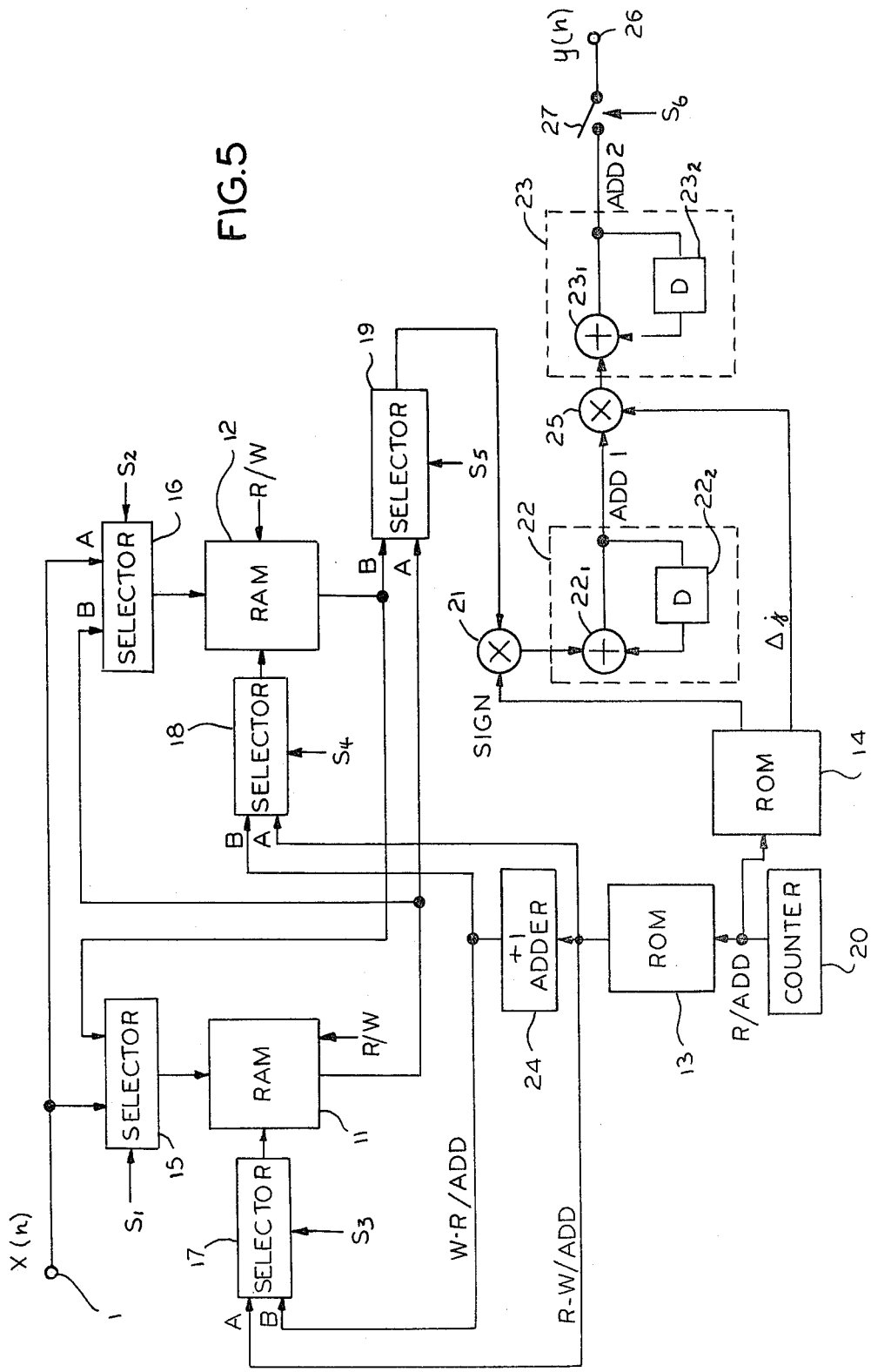
FIG. 5 shows a block diagram illustrating a second embodiment of the invention.

FIG. 5 shows a second embodiment which is designed to perform the filtering operations expressed by equations (6) through (8). These operations will be described by referring to FIG. 5 and FIGS. 6 (a) to (t). It is assumed now that, in equation (1), the number of the delay elements used is 5, the number of the coefficients $h_i$ is 6 ($|h_3| \leq |h_0| \leq |h_1| \leq |h_5| \leq |h_2| \leq |h_4|$), and the codewords taken out of the delay elements are $D_0$ to $D_5$. The input codewords are arranged as codewords $D_4$, $D_2$, $D_5$, $D_1$, $D_0$, and $D_3$ corresponding to the coefficients $h^*_0$ to $h^*_5$ depending on the arrangement of the coefficients $h_0$ to $h_5$ in the order of absolute values of magnitude. This arrangement is made by the use of random access memories (RAMs) 11 and 12, selectors 15-19, a plus-one-adder 24, read only memory (ROM) 13, and a counter 20. It is noted that each of the RAMs 11 and 12 performs the read-out or write-in operation in response to a control signal R/W shown in FIG. 6(h).

A plurality of codewords $D_0$ to $D_5$ are written through the selector 15 into addresses 0 through 5 of the RAM 11 in response to write-in address signals given by the ROM 13. A reading out of the ROM 13 and a ROM 14 described below, is achieved in response to a read-out address (R/ADD) given from the counter 20 (see FIG. 6 (i)). In this state, each of the selectors 16 and 18 selects its terminal B in response to the low level ("0") of control signals $S_2$ and $S_4$ (FIGS. 6 (c) and (e)). Each of the selectors 17 and 19 selects its terminal A in response to the high level ("1") of control signals $S_3$ and $S_5$ (FIGS. 6 (d) and (j)).

Next, the content of the RAM 11 is read out in response to a read-out address R.W/ADD for the arrangement given from the ROM 13 through the terminal A of the selector 17 to produce the outputs $x^*(n-j)$ to a multiplier 21. Since there is a relationship of $|h_3| \leq |h_0| \leq |h_1| \leq |h_5| \leq |h_2| \leq |h_4|$ for the coefficients $h_0$ to $h_5$, the arrangement address R.W/ADD for the codewords $D_0$ to $D_5$ is set as to read them out in the order of $D_4$, $D_2$, $D_5$, $D_1$, $D_0$, and $D_3$ as shown in FIG. 6 (f).

Figure 6:
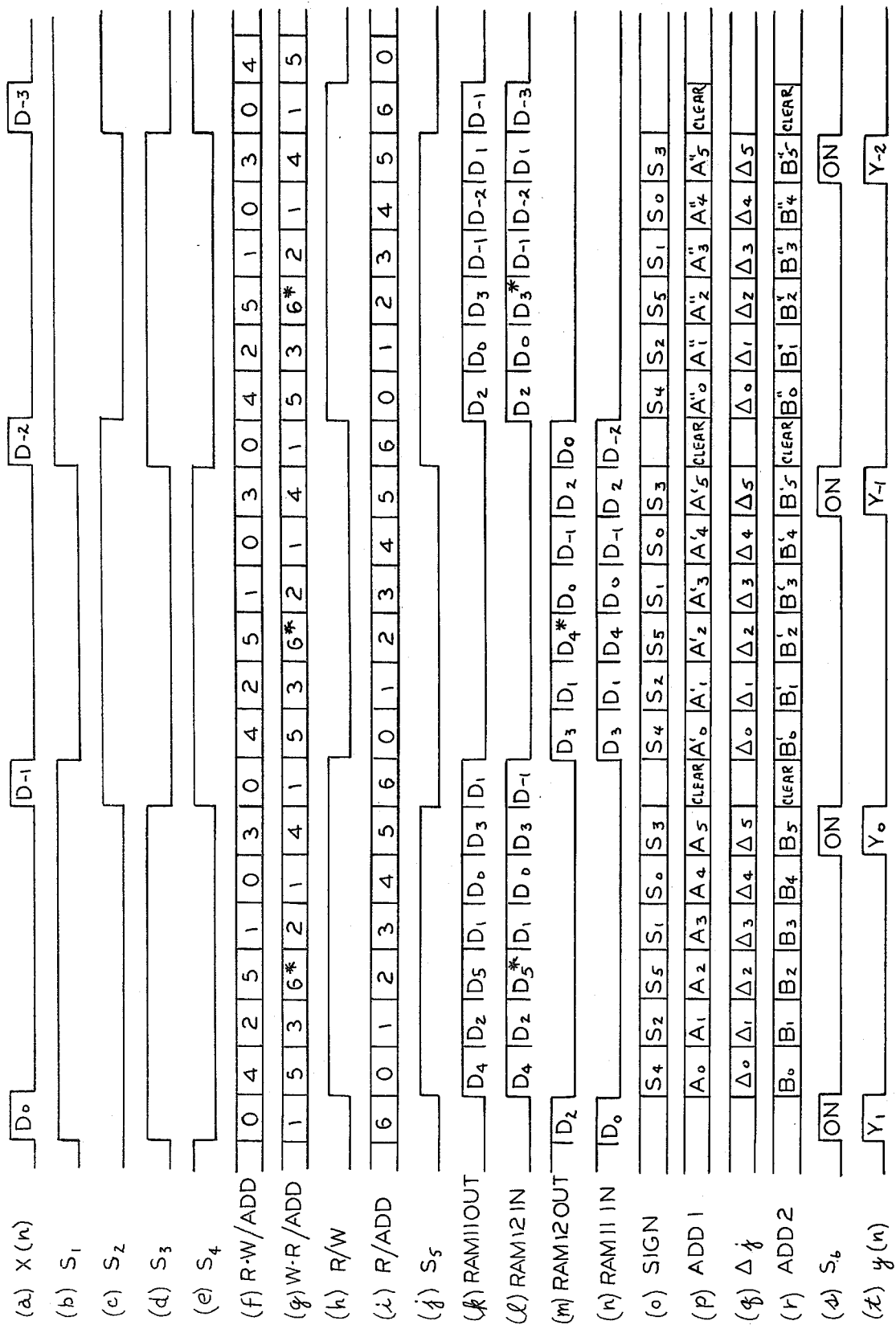
FIGS. 6(a) to (t) are time charts for describing the operation of the filter shown in FIG. 5.

Of these codewords read out from the RAM 11 (FIG. 6 (k)), $D_0$ to $D_4$ are stored at the 0-th through the 4-th addresses and are written through the terminal B of the selector 16 into the first through the fourth addresses of the RAM 12 (FIG. 6(l)), in response to a write-in address W.R/ADD (FIG. 6 (g)) given through the terminal B of the selector 18 from the ROM 13. The write-in address is produced by adding 1 to a read-out address given to the adder 24, from the ROM 13. In FIG. 6(l), the codeword $D_5$, which is not stored in the RAM 12, is expressed as $D^*_5$.

Codewords $D_4$, $D_2$, $D_5$, $D_1$, $D_0$, and $D_3$, corresponding to $x^*(n-j)$ read out of the RAM 11, are given to the multiplier 21 by way of the terminal A of the selector 19, so that they are multiplied by the corresponding sign bits (FIG. 6(O)) of the coefficients $h^*_j$ corresponding to $x^*(n-j)$, which are read out of the ROM 14. The consequent outputs $\tilde{X}*(n-j)$ of the multiplier 21 are given to a first accumulator 22 comprising a delay element $22_2$ and an adder $22_1$. As a result, the calculations $u(n)$ to $u(n-5)$ defined in equation (5) are made, $u(n)$ to $u(n-5)$ are represented as $A_0$ to $A_5$ in FIG. 6 (p), which have the following relationship:

| $u(n-j)$, where $j = 0$ to 5 | |
|---|---|
| $u(n-5) = A_0 = S_4D_4$ | $u(n-2) = A_3 = A_2 + S_1D_1$ |
| $u(n-4) = A_1 = A_0 + S_2D_2$ | $u(n-1) = A_4 = A_3 + S_0D_0$ |
| $u(n-3) = A_2 = A_1 + S_5D_5$ | $u(n) = A_5 = A_4 + S_3D_3$ |

The outputs $A_0$ to $A_5$ of the first accumulator 22 and the coefficients $\Delta_j(\Delta_0$ to $\Delta_5)$ (FIG. 6 (g)) read out of the ROM 14 are multiplied by each other in a multiplier 25 to calculate $\Delta_j u(n-j)$, that is, $B_0$ to $B_5$(FIG. 6 (r)). The outputs $B_0$ to $B_5$ of the multiplier 25 are accumulated by a second accumulator 23 comprising a delay element $23_2$ and an adder $23_1$. The outputs $B_0$ to $B_5$ of FIG. 6 (r) are as follows:

| $\Delta_j$ ($j = 0$ to 5) | $\Delta_j u(n-j)$ ($j = 0$ to 5) |
|---|---|
| $\Delta_0 = \|h_4\| - \|h_2\|$ | $\Delta_0 u(n-5) = B_0 = \Delta_0 A_0$ |
| $\Delta_1 = \|h_2\| - \|h_5\|$ | $\Delta_1 u(n-4) = B_1 = B_0 + \Delta_1 A_1$ |
| $\Delta_2 = \|h_5\| - \|h_1\|$ | $\Delta_2 u(n-3) = B_2 = B_1 + \Delta_2 A_2$ |
| $\Delta_3 = \|h_1\| - \|h_0\|$ | $\Delta_3 u(n-2) = B_3 = B_2 + \Delta_3 A_3$ |
| $\Delta_4 = \|h_0\| - \|h_3\|$ | $\Delta_4 u(n-1) = B_4 = B_3 + \Delta_4 A_4$ |
| $\Delta_5 = \|h_3\|$ | $\Delta_5 u(n) = B_5 = B_4 + \Delta_5 A_5$ |

The output of the accumulator 23 is taken out as the filtering output $y(n)$ by way of a switch 27, which operates in response to a control signal $S_6$ (FIG. 6 (s)). Upon completion of the filtering operation of one codeword, the accumulators 22 and 23 are cleared, and the selectors 16 and 18 select their terminals A in response to "1" of the control signals $S_2$ and $S_4$, while the selectors 17 and 19 select their terminals B. Simultaneously, for the filtering operation for the next codeword, the codeword $D_{-1}$ is written into the 0-th address of the RAM 12 via the input terminal 1.

Similarly, the codewords $D_{-1}$, $D_0$, $D_1$, $D_2$, $D_3$, and $D_4$ are read out of the RAM 12 in response to the arrangement address R.W/ADD, to obtain $x^*(n-j)$ (FIG. 6 (m)). At the same time, codewords other than $D_4$, i.e., codewords $D_{-1}$ to $D_3$, are stored in the RAM 11 (FIG. 6 (n)). Then, the multiplications by the sign bits (FIG. 6 (O)) are achieved in the multiplier 21. Further the values of $u(n-j)$, $\Delta_j u(n-j)$, and $$y(n) = \sum_{j=0}^{N-1} \Delta_j u(n-j) \qquad 5$$

are obtained from the first accumulator 22, multiplier 25, and second accumulator 23, respectively. Then, to prepare the filtering operation for the next codeword, the codeword $D_{-2}$ is written into the RAM 11. Thus, with this embodiment, the RAMs 11 and 12 are alternately used to arrange the codewords.

Each of the ROMs 13 and 14 may be composed of a ROM of the type illustrated in FIG. 2 of the U.S. Pat. No. 4,215,415, while each of the RAMs 11 and 12 may be composed of a memory similar to the A store shown in FIG. 3 of the U.S. Pat. No. 3,903,371. Further, the selectors 15 to 19 may be made up of multiplexers referred to in "Signetics Logic—TTL DATA Manual", May 1978, Signetics Corporation, pp. 232-234.

Although, in the embodiments, the coefficient differences are taken once or twice depending on equations (6) through (10), the frequency to be taken out may be much larger.

As discussed above, the present invention greatly contributes to reducing the number of multiplications by the use of the novel hardware.

What is claimed is:

1. A non-recursive digital filter having predetermined N filter coefficients $h_i (i=0$ to $N-1)$ to perform $$y(n) = \sum_{i=0}^{N-1} h_i x(n-i) = \sum_{j=0}^{N-1} \text{sign}(h_j) h^*_j x^*(n-j) =$$

$$\sum_{j=0}^{N-1} h^*_j \tilde{x}^*(n-j) = \sum_{j=0}^{N-1} \Delta_j u(n-j)$$

in response to a sequence $x(n-i)$ of N consecutive binary coded words, where $h^*_j$ represent the coefficients of the absolute values of $h_i$ arranged in the order of magnitude; $x^*(n-j)$ represent $x(n-i)$ corresponding to $h^*_j$; sign $(h_i)$ represent the polarities of $h$; $\Delta_j$ represent differences between adjoining coefficients $h^*_j$; $\tilde{x}^*(n-j)$ represent the products of sign $(h_i)$ and $x^*(n-j)$; and $$u(n-j) = \sum_{k=j}^{N-1} \tilde{x}^*(n-k),$$

said filter comprising:
arranging means for arranging said sequence $x(n-i)$ corresponding to the coefficients $h^*_j$ to obtain $x^*(n-j)$; first means for obtaining the product of each of the outputs $x^*(n-j)$ given from the arranging means and the corresponding polarity of each of the coefficients $h_i$; second means for accumulating the outputs $\tilde{x}^*(n-j)$ given from said first means to obtain $u(n-j)$; coefficient generating means for producing said differences $\Delta_j$; third means for multiplying the outputs $u(n-j)$ supplied from said second means by said differences $\Delta_j$; and fourth means for accumulating outputs $\Delta_j u(n-j)$ given from said third means.

2. A non-recursive digital filter having predetermined N filter coefficients $h_i(i=0$ to $N-1)$ to perform $$y(n) = \sum_{i=0}^{N-1} h_i x(n-i) = \sum_{j=0}^{N-1} \text{sign}(h_j) h^*_j x^*(n-j) =$$

$$\sum_{j=0}^{N-1} h^*_j \tilde{x}^*(n-j) = \sum_{j=0}^{N-1} \Delta_j u(n-j) = \sum_{l=0}^{N-1} C_l u(n-l)$$

in response to a sequence $x(n-i)$ of N consecutive binary coded words, where $h^*_j$ represent the coefficients of the absolute values of $h_i$ arranged in the order of magnitude; $x^*(n-j)$ represent $x(n-i)$ corresponding to $h^*_j$; sign $(h_i)$ represent the polarities of $h_i$; $\Delta_j$ represent differences between adjoining coefficients $h^*_j$; $\tilde{x}^*(n-j)$ represent the products of sign $(h_i)$ and $x^*(n-j)$;

$$u(n-j) = u(n-j) = \sum_{k=j}^{N-1} \tilde{x}^*(n-k);$$

$C_l$ represent differences between adjoining coefficients $\Delta_j^*$ obtained by arranging $\Delta_j$ in the order of magnitude;

$$u(n-l) = \sum_{k=l}^{N-1} u^*(n-k);$$

and $u^*(n-l)$ represent $u(n-j)$ corresponding to $\Delta^*_l$, said filter comprising:
first arranged means for arranging said sequence $x(n-i)$ corresponding to the coefficients $h^*_j$ to obtain $x^*(n-j)$; first arithmetic means for obtaining the product each of outputs $x^*(n-j)$ given from the first arranging means and the corresponding polarity of each of the coefficients $h_i$; first adding means for accumulating the outputs $\tilde{x}^*(n-j)$ given from the first arithmetic means to obtain $u(n-j)$; second arranging means for arranging the outputs $u(n-j)$ supplied from said first adding means corresponding to the coefficients $\Delta^*_l$ to produce $u^*(n-l)$; second adding means for accumulating the outputs fed from the second arranging means to obtain $u(n-l)$; coefficient generating means for producing said coefficients $C_l$; second arithmetic means for multiplying the outputs $u(n-l)$ supplied from the second adding means by said coefficients $C_l$; and third adding means for accumulating the outputs $C_l u(n-l)$ given from the second arithmetic means.

3. A non-recursive digital filter comprising a pair of random access memory means, each of said random access memory means including means for processing digital signal code words having different coefficients by arranging said digital signal code words according to the coefficients of said digital signal code words and the differences between said digital signal code words, read only memory means for driving each of said random access memory means through a sequence of operational steps, selector means responsive to said read only memory means for alternately operating said random access memory means, and addressing means for successively addressing said random access memory means for successively scanning the contents of said random access memory means, means for multiplying an output of an operating one of the random access memory means selected by said selector means in order to establish a digital sign, means responsive to said multiplying means for accumulating a codeword from said products of the multiplications, and means for multiplying the output of said accumulating means by differences between absolute values of said coefficients, as new coefficients.

4. A method of filtering digital signals comprising the steps of:

a. converting analog signals into digital signals to provide binary coded words, said digital signals having different coefficients;

b. arranging said digital signals in a sequence corresponding to said coefficients;

c. multiplying said arranged signals by a signal representing a sign of said digital signals;

d. accumulating products of the multiplication of step c;

e. multiplying said accumulated digital signals by differences between absolute values of said coefficients, as new coefficients; and f. accumulating the products of the multiplication of step e.

* * * * *